United States Patent
Tsai et al.

(10) Patent No.: US 7,043,327 B2
(45) Date of Patent: May 9, 2006

(54) LITHOGRAPHY APPARATUS AND METHOD EMPLOYING NON-ENVIRONMENTAL VARIABLE CORRECTION

(75) Inventors: Fei Gwo Tsai, Tainan (TW); Chun-Lang Chen, Tainan County (TW); Cheng I Sun, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 307 days.

(21) Appl. No.: 10/639,967

(22) Filed: Aug. 12, 2003

(65) Prior Publication Data

US 2005/0037266 A1 Feb. 17, 2005

(51) Int. Cl.
 *G06F 19/00* (2006.01)
(52) U.S. Cl. .......... 700/121; 700/182; 430/30
(58) Field of Classification Search ........ 700/119–121, 700/182; 430/5, 30; 761/21; 250/491
 See application file for complete search history.

(56) References Cited

U.S. PATENT DOCUMENTS

| 4,742,233 | A * | 5/1988 | Kuyel ............... 250/491.1 |
| 6,210,843 | B1 | 4/2001 | Chen et al. |
| 6,368,883 | B1 | 4/2002 | Bode et al. |
| 6,535,774 | B1 | 3/2003 | Bode et al. |
| 6,828,068 | B1 * | 12/2004 | Progler et al. ........... 430/5 |
| 2003/0228532 | A1 * | 12/2003 | Mui et al. ............... 430/30 |
| 2004/0063003 | A1 * | 4/2004 | Montgomery et al. ...... 430/5 |
| 2004/0259042 | A1 * | 12/2004 | Fritze et al. ............. 430/394 |

FOREIGN PATENT DOCUMENTS

JP 2002-099072 4/2002

OTHER PUBLICATIONS

Abstract of GB807574, Process for the production of electrolytic copper coatings, Dec. 20, 2003, pp. 5-6.
Abstract of GB827817, Improvements in or relating to electroplating copper, Dec. 27, 2003.

* cited by examiner

*Primary Examiner*—Kidest Bahta
(74) *Attorney, Agent, or Firm*—Tung & Assoc.

(57) ABSTRACT

A lithographic apparatus for forming a patterned resist layer and a method for forming a microelectronic product both employ a lithographic exposure tool controller designed to: (1) receive input data for at least one non-environmental variable that influences an exposure dose when forming a patterned resist layer from a blanket resist layer while employing a lithographic exposure tool; and (2) determine the exposure dose for forming the patterned resist layer from the blanket resist layer while employing the input data. The apparatus and method provide for forming the microelectronic product with enhanced dimensional control.

20 Claims, 2 Drawing Sheets

LITHOGRAPHY APPARATUS AND METHOD EMPLOYING NON-ENVIRONMENTAL VARIABLE CORRECTION

BACKGROUND OF THE INVENTION

1. Field of the Invention

The invention relates generally to lithographic methods for forming patterned resist layers and patterned microelectronic layers within microelectronic products. More particularly, the invention relates to lithographic methods for accurately and efficiently forming patterned resist layers and patterned microelectronic layers within microelectronic products.

2. Description of the Related Art

As microelectronic device dimensions continue to decrease, difficulties in achieving critical dimension tolerances of microelectronic devices and patterned layers within microelectronic products generally continue to increase. Critical dimension tolerances may be influenced by various factors, not all of which are readily ascertained. Critical dimensions of microelectronic devices and patterned layers are defined employing lithographic methods, such as electron beam lithographic methods and photolithographic methods.

It is thus desirable to provide lithographic methods that in turn provide microelectronic devices and patterned layers with enhanced dimensional control. It is towards the foregoing object that the present invention is directed.

Various lithographic apparatus and methods having desirable properties have been disclosed in the microelectronic product fabrication art.

Included but not limiting among the apparatus and methods are those disclosed within: (1) Chen et al., in U.S. Pat. No. 6,210,843 (a differential electron beam dose method for forming a photomask with enhanced dimensional control); (2) Bode et al., in U.S. Pat. No. 6,368,883 (an apparatus and method for identifying and controlling effects of ambient conditions within photolithographic processes); and (3) Bode et al., in U.S. Pat. No. 6,535,774 (an apparatus and method that provide for enhanced overlay registration when forming patterned layers within microelectronic products).

The disclosure of each of the foregoing references is incorporated herein fully by reference.

Desirable are additional lithographic apparatus and methods for forming microelectronic devices and patterned layers with enhanced dimensional control within microelectronic products. The present invention is directed towards the foregoing object.

SUMMARY OF THE INVENTION

A first object of the invention is to provide a lithographic apparatus and a lithographic method for forming a patterned layer within a microelectronic product.

A second object of the invention is to provide a lithographic apparatus and a lithographic method in accord with the first object of the invention, wherein the patterned layer is formed with enhanced dimensional control.

In accord with the objects of the invention, the invention provides a lithographic apparatus and a lithographic method for forming a patterned layer with enhanced dimensional control within a microelectronic product.

In accord with the invention, the apparatus comprises a lithographic exposure tool. The apparatus also comprises a lithographic exposure tool controller programmed to: (1) receive input data for at least one non-environmental variable that influences an exposure dose when forming a patterned resist layer from a blanket resist layer while employing the lithographic exposure tool; and (2) determine the exposure dose for forming the patterned resist layer from the blanket resist layer while employing the input data. Within the apparatus, the at least one non-environmental variable may be selected from the group consisting of discrete non-environmental variables and continuous non-environmental variables.

The apparatus in accord with the invention contemplates a method for forming a patterned resist layer or a patterned target layer thereunder while employing the apparatus in accord with the invention.

The invention provides a method for forming a patterned layer within enhanced dimensional control within a microelectronic product.

The invention realizes the foregoing object by employing within a lithographic apparatus a controller that employs input data for at least one non-environmental variable when determining an exposure dose for forming a patterned resist layer from a blanket resist layer.

BRIEF DESCRIPTION OF THE DRAWINGS

The objects features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for forming a patterned layer within enhanced dimensional control within a microelectronic product.

The invention realizes the foregoing object by employing within a lithographic apparatus a controller that employs input data for at least one non-environmental variable when determining an exposure dose for forming a patterned resist layer from a blanket resist layer.

Figure 1:
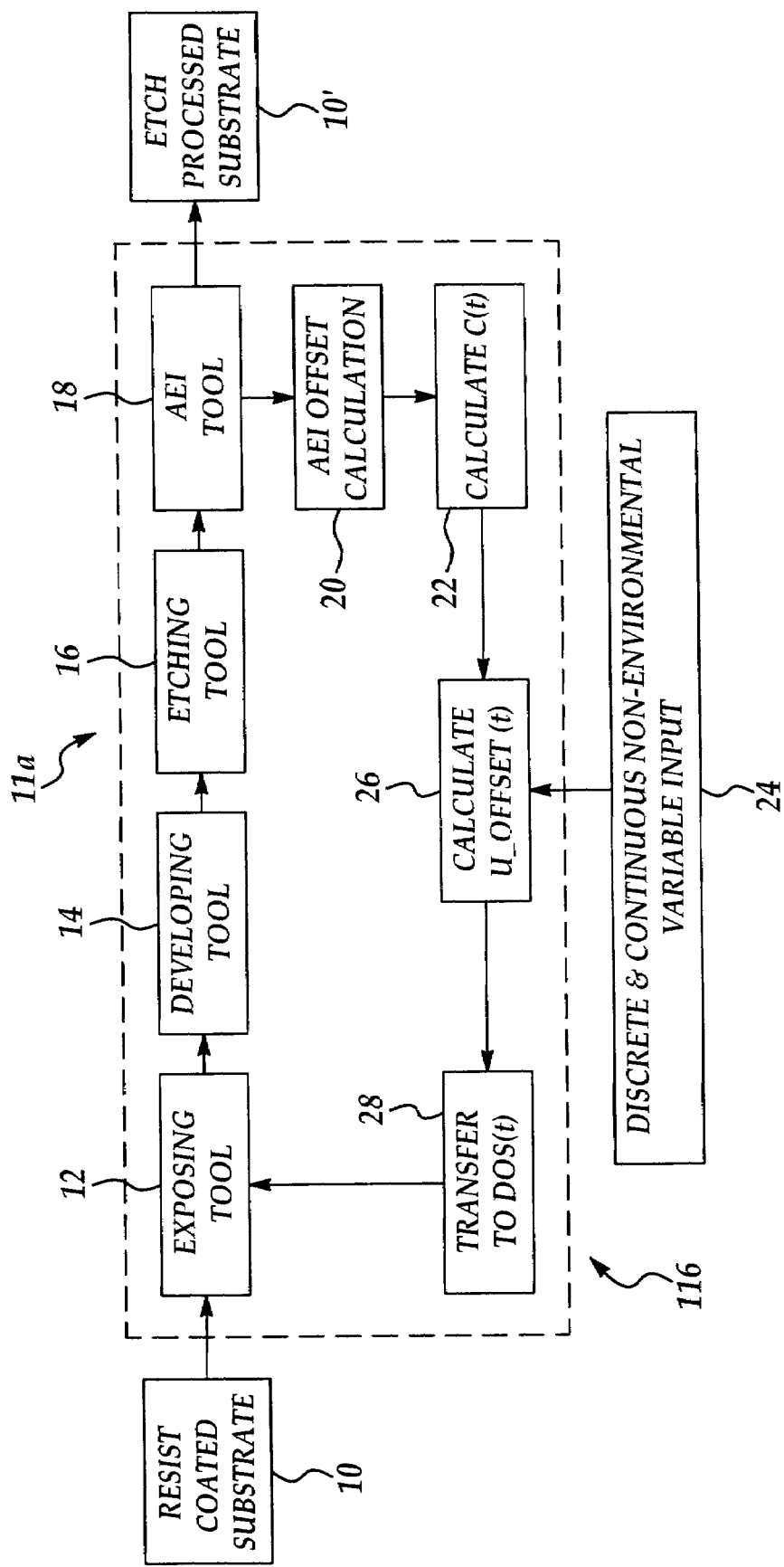
FIG. 1 shows a schematic diagram of operation of a lithography apparatus in accord with the invention.

FIG. 1 shows a schematic diagram of a lithographic apparatus and its operation, in accord with the invention.

FIG. 1 shows a resist coated substrate 10 that enters a processing portion 11a of the lithographic apparatus and exits therefrom as an etch processed substrate 10'. FIG. 1 also shows a controller portion 11b of the lithographic apparatus.

In accord with the invention, the nature of the resist coated substrate 10 and the etch processed substrate 10' are discussed in further detail below.

As is further illustrated within FIG. 1, the processing portion 11a of the lithographic apparatus comprises in sequence: (1) an exposing tool 12; (2) a developing tool 14; (3) an etching tool 16; and (4) an after etch inspection (AEI) tool 18. A photoresist stripping tool may also be included interposed between the etching tool 16 and the after etch inspection tool 18, although the same is not specifically illustrated in FIG. 1. Each of the foregoing tools within the processing portion 11a of the lithographic apparatus of FIG.

1 may be otherwise generally conventional in the microelectronic product fabrication art.

The exposing tool 12 may be selected from the group including but not limited to electron beam exposing tools and optical exposing tools. More typically, the exposing tool 12 will be an electron beam exposing tool.

The developing tool 14 will employ a developer as is appropriate to a resist material from which is formed the resist coated substrate 10. When the resist coated substrate 10 employs a chemically amplified resist, the developer will typically be an aqueous base type developer.

The etching tool 16 may include an etching tool selected from the group including but not limited to wet chemical etching tools and dry plasma etching tools. More typically, the etching tool 16 comprises a dry plasma etching tool such that an appropriate layer or structure within the resist coated substrate may (after exposing and developing a blanket resist layer to form a patterned resist layer) be anisotropically etched to provide enhanced dimensional control.

Finally, the after etch inspection tool 18 may include an after etch inspection tool selected from the group including but not limited to electron beam inspection tools (i.e., scanning electron microscopy tools) and optical inspection tools (i.e., optical diffraction tools, optical reflection tools and optical scattering tools).

With respect to the controller portion 11b of the lithographic apparatus as illustrated in FIG. 1, and in accord with reference numeral 20, an after etch inspection (AEI) offset calculation is first undertaken for a photoresist coated substrate 10 that has been processed within the processing portion 11a of the lithographic apparatus as illustrated in FIG. 1 to form an etch processed substrate 10'. The after etch inspection (AEI) offset calculation may be undertaken in accord with equation 1, as follows:

$$AEI\ \text{Offset} = \text{Average}\ [AEI(t-1) - CD\ \text{target}] \quad (1)$$

In accord with equation 1, an after etch inspection (AEI) offset for a specific etch processed substrate 10' is calculated as an average of deviations of prior after etch inspection (AEI) measurements of prior etch processed substrates from a critical dimension (CD) target value.

In accord with reference numeral 22, the invention next provides for calculation of a C(t) value, where C(t) is an exponentially weighted moving average (EWMA) factor for a dynamic response. The C(t) value may be calculated in accord with equation 2, as follows:

$$C(t) = w * AEI\ \text{offset} + C(t-1) \quad (2)$$

Within equation 2, w is an experimentally determined weighting factor that varies between 0 and 1. C(t−1) is an exponentially weighted moving average (EWMA) factor for an immediately preceding after etch inspect offset calculation. Alternative exponentially weighted moving average (EWMA) factor calculations may be found within the references cited within the Description of the Related Art, the disclosures of which are incorporated herein fully by reference.

In accord with reference numeral 26, the invention next provides for a calculation of a U-offset(t) value. The U_offset(t) value is calculated while employing at least one non-environmental variable value that influences an exposure dose employed within the exposing tool 12 for forming an exposed resist coated substrate from an additional resist coated substrate 10. Non-environmental variables are intended as variables other than temperature, humidity and pressure. The non-environmental variable value is selected from the group consisting of discrete non-environmental variable values and continuous non-environmental variable values in accord with reference numeral 24.

Within the context of the invention, the discrete non-environmental variables are intended as variables that do not vary as a function of some other parameter, such as time, but that nonetheless contribute to an offset correction to a dose of exposure radiation employed for exposing a blanket resist layer within a resist coated substrate when forming therefrom an exposed resist coated substrate. Such variables may include but are not limited to: (1) a specific layer (L) offset correction for the dose of exposure radiation; (2) an optical proximity effect (O) offset correction for the dose of exposure radiation; (3) a radiation source (W) offset correction for the dose of exposure radiation; and (4) and an etcher source (D) offset correction for the dose of exposure radiation. Additional discrete variables may include product type variables and customer requirement variables. In contrast, continuous non-environmental variables are variables whose contribution to a radiation dose offset correction vary as a function of an additional parameter. Examples of continuous variables may include, but are not limited to: (1) blanket resist layer coating delay (PCD) time to exposure offset correction; and (2) patterned photoresist layer pattern density (PD) offset correction. Additional continuous variables may include resist material production to use delay variables and microelectronic product device density variables.

To ascertain the existence of both discrete non-environmental variables and continuous non-environmental variables, an analysis of variance (ANOVA) analysis may be undertaken with respect to variables that are intended or expected as either discrete variables or continuous variables. The analysis of variance analysis may be undertaken as a simple cause and effect analysis intended towards identifying variables that provide a radiation exposure offset correction when forming an exposed resist coated substrate. Once the discrete variables and continuous variables have been identified, the U_offset(t) value derived therefrom may be calculated in accord with equation 3, as follows:

$$U\_\text{offset}(t) = a + L(i) + O(j) + W(k) + D(l) \ldots \text{(for all discrete variables)} + b*f(PCD) + c*f(PD) \ldots \text{(for all continuous variables)} + C(t) \quad (3)$$

Within equation 3, the coefficients a, b and c are determined experimentally. The offset contribution factors L, O, W, D, PCD and PD are defined above. Within equation 3, the exponentially weighted moving average C(t) and the discrete variables provide a direct contribution of the U_offset(t) value and the continuous variables provide a less direct contribution of the U_offset(t) value. The continuous variables are first subject to a regression analysis to discern an appropriate functionally regressed contribution to the U_offset(t) value. The regression analysis may be undertaken employing methods as are conventional in the art. The method will typically employ a line fitting or a curve fitting to an accumulated data set for each individual variable such that the sum of squares from individual data points to the line or curve is minimized. The invention also contemplates an overall regression analysis of U_offset(t) values employing a statistical R-square analysis such as to ascertain adequate curve fitting for a U_offset(t) values.

Finally, as illustrated within FIG. 1, the U_offset(t) value (which is intended to be calculated as a radiation dosage offset) is forwarded to a dosage controller 28 that in turn defines a radiation dosage to be employed in the exposing tool 12 for exposing the next photoresist coated substrate 10. Thus, the controller portion 11b of the lithographic apparatus as illustrated in FIG. 1 operates in a feedback mode where an after etch inspection measurement obtained from an after etch inspection tool 18 for a specific etch processed substrate 10' is employed within a feedback loop to determine an optimized dose of radiation for exposing a subsequent resist coated substrate 10 when forming therefrom a subsequent etch processed substrate 10'.

FIG. 2 to FIG. 6 show the results of progressive stages in forming a microelectronic product in accord with a preferred embodiment of the invention.

Figure 2:
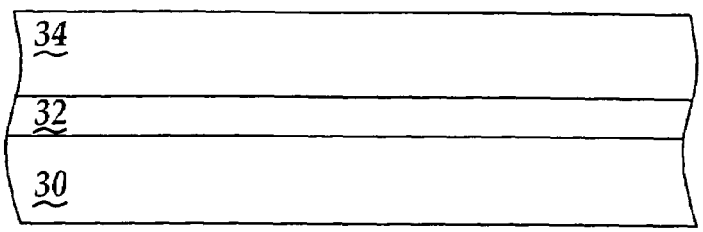
FIG. 2, FIG. 3, FIG. 4, FIG. 5 and FIG. 6 show a series of schematic cross-sectional diagrams illustrating the results of forming a patterned layer over a substrate in accord with a preferred embodiment of the invention.

FIG. 2 shows a substrate 30. A blanket target layer 32 is formed upon the substrate 30 and a blanket photoresist layer 34 is formed upon the blanket target layer 32.

The substrate 30 may be employed within a microelectronic product selected from the group including but not limited to integrated circuit products, ceramic substrate products and optoelectronic products. More preferably, the substrate 30 is a transparent substrate employed within a photomask. The transparent substrate is typically formed of a quartz material.

The blanket target layer 32 may in general be formed of a microelectronic material selected from the group including but not limited to conductor materials, semiconductor materials and dielectric materials. More preferably, the blanket target metal layer 32 is a blanket opaque masking layer, such as is formed of a chromium material, and as is further employed when forming a photomask from the microelectronic product as illustrated in FIG. 2.

Finally, the blanket photoresist layer 34 may be formed of photoresist materials as are conventional in the microelectronic product fabrication art, including but not limited to positive photoresist materials and negative photoresist materials. Preferably, the blanket photoresist layer 34 is formed of a chemically amplified photoresist material, such as to provide for enhanced precision and accuracy when forming a patterned photoresist layer from the blanket photoresist layer 34.

Figure 3:
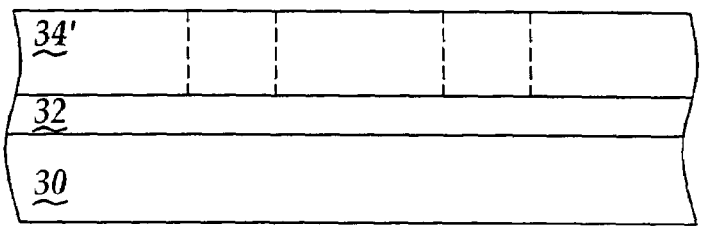

FIG. 3 shows the results of exposing the blanket photoresist layer 34 to form an exposed blanket photoresist layer 34' in accord with the invention. The exposure is undertaken in accord with the calculation of the U_offset(t) value as discussed above in accord with reference numeral 26 within FIG. 1. The U_offset(t) value is calculated as a radiation dose exposure correction and is forwarded to the dosage controller 28 as illustrated in FIG. 1.

Figure 4:
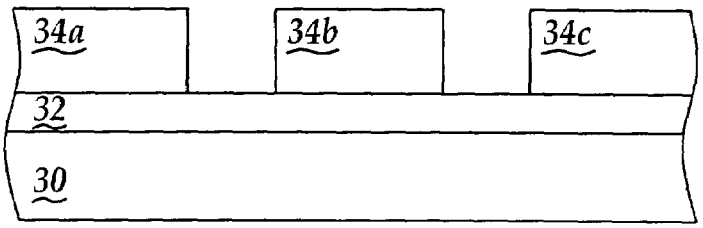

FIG. 4 shows the results of developing the exposed blanket photoresist layer 34' to form a series of patterned photoresist layers 34a, 34b and 34c. The exposed blanket photoresist layer 34 may be developed to form the series of patterned photoresist layers 34a, 34b and 34c while employing a developer as is appropriate to the photoresist material from which is formed the exposed blanket photoresist layer 34'.

Figure 5:
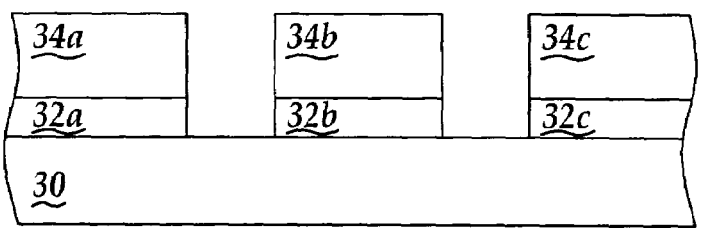

FIG. 5 shows the results of etching the blanket target layer to form a series of patterned target layers 32a, 32b and 32c while employing the series of patterned photoresist layers 34a, 34b and 34c as a series of etch mask layers. Typically, the blanket target layer 32 is etched to form the series of patterned target layers 32a, 32b and 32c while employing an anisotropic plasma etchant, such that the series of patterned target layers 32a, 32b and 32c is formed with optimal dimensional control.

Figure 6:
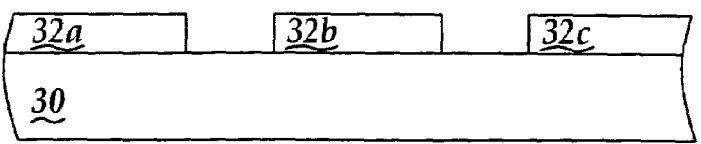

Finally, FIG. 6 illustrates the results of stripping the series of patterned photoresist layers 34a, 34b and 34c from the series of patterned target layers 32a, 32b and 32c, such as to form a microelectronic product in accord with the invention. Preferably, the microelectronic product is a photomask formed employing a chemically amplified photoresist material which is exposed employing an electron beam exposure apparatus that employs calculation of a electron beam dosage derived from input data from a series of discrete non-environmental variables and a series of continuous non-environmental variables.

The preferred embodiment of the invention is illustrative of the invention rather than limiting of the invention. Revisions and modifications may be made to methods, materials, structures and dimensions in accord with the preferred embodiment of the invention while still providing embodiments in accord with the invention, further in accord with the accompanying claims.

What is claimed is:

1. A method for fabricating a photomask comprising:
  providing a blanket resist layer coated photomask blank;
  providing a lithographic apparatus comprising:
    a lithographic exposure tool; and
    a lithographic exposure tool controller programmed to:
      receive input data for at least one non-environmental variable that influences an exposure dose when forming a patterned resist layer from the blanket resist layer while employing the lithographic exposure tool, said input data derived from a previously exposed different resist layer on a different photomask blank; and
      determine the exposure dose for forming the patterned resist layer from the blanket resist layer while employing the input data;
  determining the exposure dose while employing the lithographic exposure tool controller; and
  exposing the blanket resist layer with the exposure dose to form an exposed blanket resist layer.

2. The method claim 1 wherein the lithographic exposure tool is selected from the group consisting of an electron beam lithographic exposure tool and a photoexposure lithographic exposure tool.

3. The method of claim 1 wherein the at least one non-environmental variable is selected from the group consisting of discrete non-environmental variables and continuous non-environmental variables.

4. The method of claim 3 wherein the discrete non-environmental variable is selected from the group consisting of a product layer variable, a proximity correction variable, a lithographic source variable and an etcher source variable.

5. The method of claim 3 wherein the continuous non-environmental variable is selected from the group consisting of a blanket photoresist layer aging variable and a patterned photoresist layer pattern density variable.

6. The method of claim 1 wherein the blanket photoresist layer is formed from a chemically amplified photoresist material.

7. The method of claim 1 wherein the exposure dose is calculated employing an exponentially weighted moving average algorithm that employs an after etch inspection measurement feedback.

8. A method for fabricating a microelectronic product comprising:
  providing substrate having formed thereover a blanket target layer in turn having formed thereover a blanket resist layer;
  providing a lithographic apparatus comprising:
    a lithographic exposure tool; and
    a lithographic exposure tool controller programmed to:
      receive input data for at least one non-environmental variable that influences an exposure dose when forming a patterned resist layer from the blanket resist layer while employing the lithographic exposure tool, said input data derived from a previously exposed developed first resist layer including subsequent etching of a first target layer, said first resist and target layers on a first substrate; and determine the exposure dose for forming the patterned resist layer from the blanket resist layer while employing the input data;

determining the exposure dose while employing the lithographic exposure tool controller; and exposing the blanket resist layer with the exposure dose to form an exposed blanket resist layer.

9. The method claim 8 wherein the lithographic exposure tool is selected from the group consisting of an electron beam lithographic exposure tool and a photoexposure lithographic exposure tool.

10. The method of claim 8 wherein the at least one non-environmental variable is selected from the group consisting of discrete non-environmental variables and continuous non-environmental variables.

11. The method of claim 10 wherein the discrete non-environmental variable is selected from the group consisting of a product layer variable, a proximity correction variable, a lithographic source variable and an etcher source variable.

12. The method of claim 10 wherein the continuous non-environmental variable is selected from the group consisting of a blanket photoresist layer aging variable and a patterned photoresist layer pattern density variable.

13. The method of claim 8 wherein the blanket photoresist layer is formed from a chemically amplified photoresist material.

14. The method of claim 8 wherein the exposure dose is calculated employing an exponentially weighted moving average algorithm that employs an after etch inspection measurement feedback.

15. A lithographic apparatus for forming a patterned resist layer comprising:

a lithographic exposure tool; and a lithographic exposure tool controller programmed to:

receive input data for at least one non-environmental variable that influences an exposure dose when forming a patterned photoresist layer from a blanket photoresist layer while employing the lithographic exposure tool, said input data derived from a separate and previously patterned resist layer; and determine the exposure dose for forming the patterned photoresist layer from the blanket layer while employing the input data.

16. The apparatus of claim 15 wherein the lithographic exposure tool is selected from the group consisting of an electron beam lithographic exposure tool and a photoexposure lithographic exposure tool.

17. The apparatus of claims 15 wherein the at least one non-environmental variable is selected from the group consisting of discrete non-environmental variables and continuous non-environmental variables.

18. The apparatus of claim 17 wherein the discrete non-environmental variable is selected from the group consisting of a product layer variable, a proximity correction variable, a lithographic source variable and an etcher source variable.

19. The apparatus of claim 17 wherein the continuous non-environmental variable is selected from the group consisting of a blanket photoresist layer aging variable and a patterned photoresist layer pattern density variable.

20. The apparatus of claim 15 wherein the exposure dose is determined employing an exponentially weighted moving average algorithm that employs an after etch inspection measurement feedback.

* * * * *